(12) United States Patent
Ju

(10) Patent No.: US 7,425,147 B2
(45) Date of Patent: Sep. 16, 2008

(54) ELECTRIC CONNECTOR WITH PRESS UNIT

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 1 day.

(21) Appl. No.: 11/488,741

(22) Filed: Jul. 19, 2006

(65) Prior Publication Data

US 2008/0176427 A1    Jul. 24, 2008

(51) Int. Cl.
H01R 13/62 (2006.01)
(52) U.S. Cl. .......................... 439/331; 439/73
(58) Field of Classification Search ............... 439/331, 439/71, 73, 940, 571, 296
See application file for complete search history.

(56) References Cited

U.S. PATENT DOCUMENTS

| | | | | |
|---|---|---|---|---|
| 3,942,854 A | * | 3/1976 | Klein et al. ................. | 439/331 |
| 4,130,327 A | * | 12/1978 | Spaulding ................... | 439/71 |
| 4,427,249 A | * | 1/1984 | Bright et al. ................. | 439/68 |
| 4,433,886 A | * | 2/1984 | Cassarly et al. .............. | 439/65 |
| 4,504,105 A | * | 3/1985 | Barkus et al. ................ | 439/331 |
| 4,601,525 A | * | 7/1986 | Kandybowski ............. | 439/329 |
| 4,621,884 A | * | 11/1986 | Berkebile et al. ........... | 439/367 |
| 4,715,835 A | * | 12/1987 | Matsuoka ................... | 439/893 |
| 4,761,140 A | * | 8/1988 | Geib ........................... | 439/71 |
| 6,244,875 B1 | * | 6/2001 | McHugh et al. ............. | 439/73 |
| 7,182,620 B1 | * | 2/2007 | Ju ............................... | 439/331 |
| 7,207,821 B1 | * | 4/2007 | Ju ............................... | 439/331 |
| 7,335,046 B2 | * | 2/2008 | Ju ............................... | 439/331 |

* cited by examiner

Primary Examiner—Michael C Zarroli
(74) Attorney, Agent, or Firm—Troxell Law Office, PLLC

(57) ABSTRACT

An electric connector having an insulating body, a plurality of terminals received in the insulating body and a press unit pressing a chip module. The press unit has at least one elastic arm. The elastic arm has a driving portion. At least one limiting body is formed on the insulating body. When the driving portion is driven, the limiting body serves to limit the elastic arm not to over-deform.

8 Claims, 6 Drawing Sheets

ELECTRIC CONNECTOR WITH PRESS UNIT

BACKGROUND OF THE INVENTION (a) Field of the Invention

The present invention relates to connectors, and in particular to improve the structure of the press unit of an electric connector.

(b) Description of the Prior Art

An electric connector of a prior art includes a body, a plurality of terminals received in the body and a press unit serving to press a chip module. The press unit usually has a through hole thereof in the middle. The two side edges of the through hole are extended inwards with a resisting portion. The cross section of the resisting portion is shaped into a cambered shape. When the press unit is pivotal to be closed, the press portion of the press unit is resisted to the chip module. Besides, the one end of the press unit is pivotal to the one end of the body of the electric connector. The other end of the press unit has a hook. The hook is buckled with a corresponding block on the insulating body. When the press unit is disassembled from the insulating body, the hook is needed to drive outwards. If a user drives the hook too hard, then the press unit will be deformed so as to reduce thereof using-expectance.

SUMMARY OF THE INVENTION

The primary objective of the present invention is to provide an electric connector. The electric connector improves the structure of a press unit so as to prevent from the press unit not to be deformed easily and increase the using-expectance thereof. In order to achieve the objective, the electric connector includes an insulating body, a plurality of terminals received in the insulating body and a press unit serving to press a chip module. The press unit has at least one of the elastic arms. The elastic arm has a driving portion. At least one of limiting bodies is formed on the insulating body. When the driving portion is driven, the limiting body serves to limit the elastic arm to be over moved so as to cause thereof out of shape.

DETAILED DESCRIPTION OF THE PREFERRED EMBODIMENTS

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
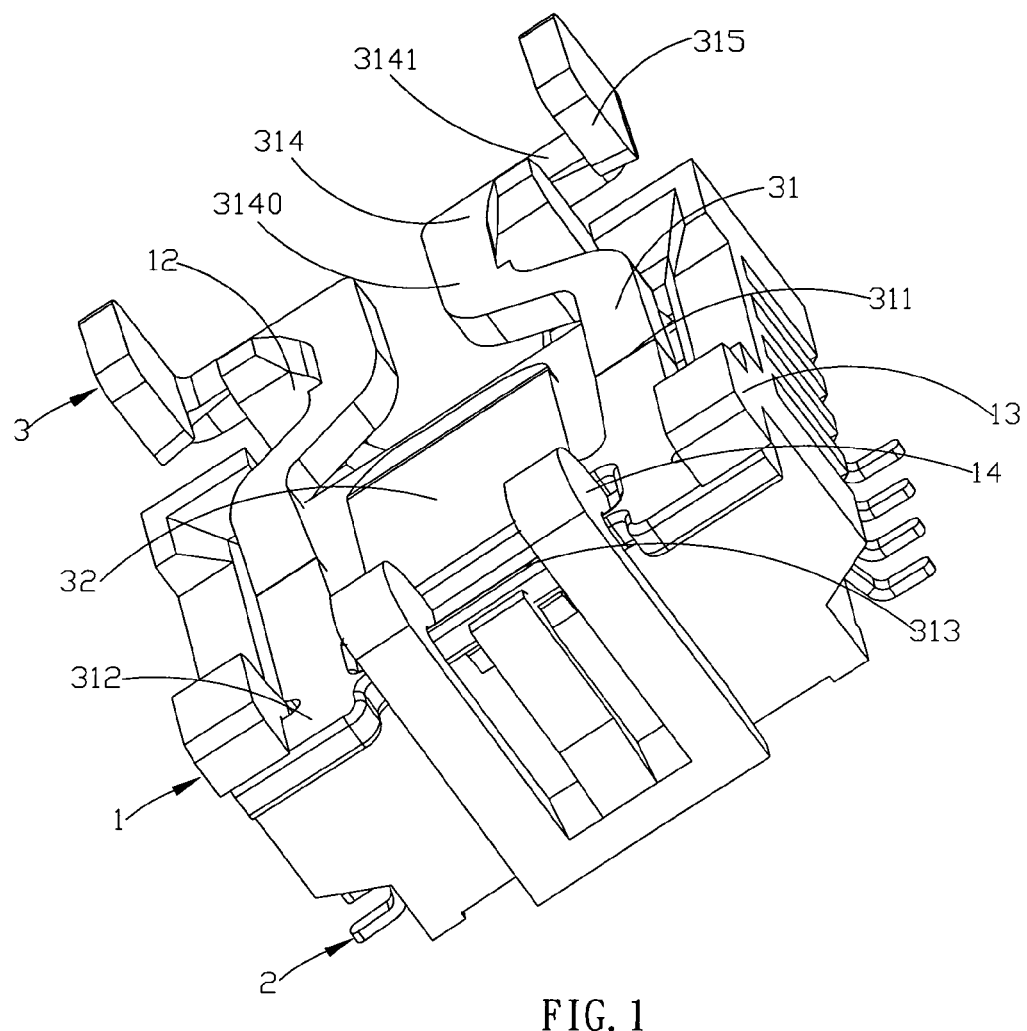
FIG. 1 is an assembled perspective view of the electric connector of the present invention.
Figure 2:
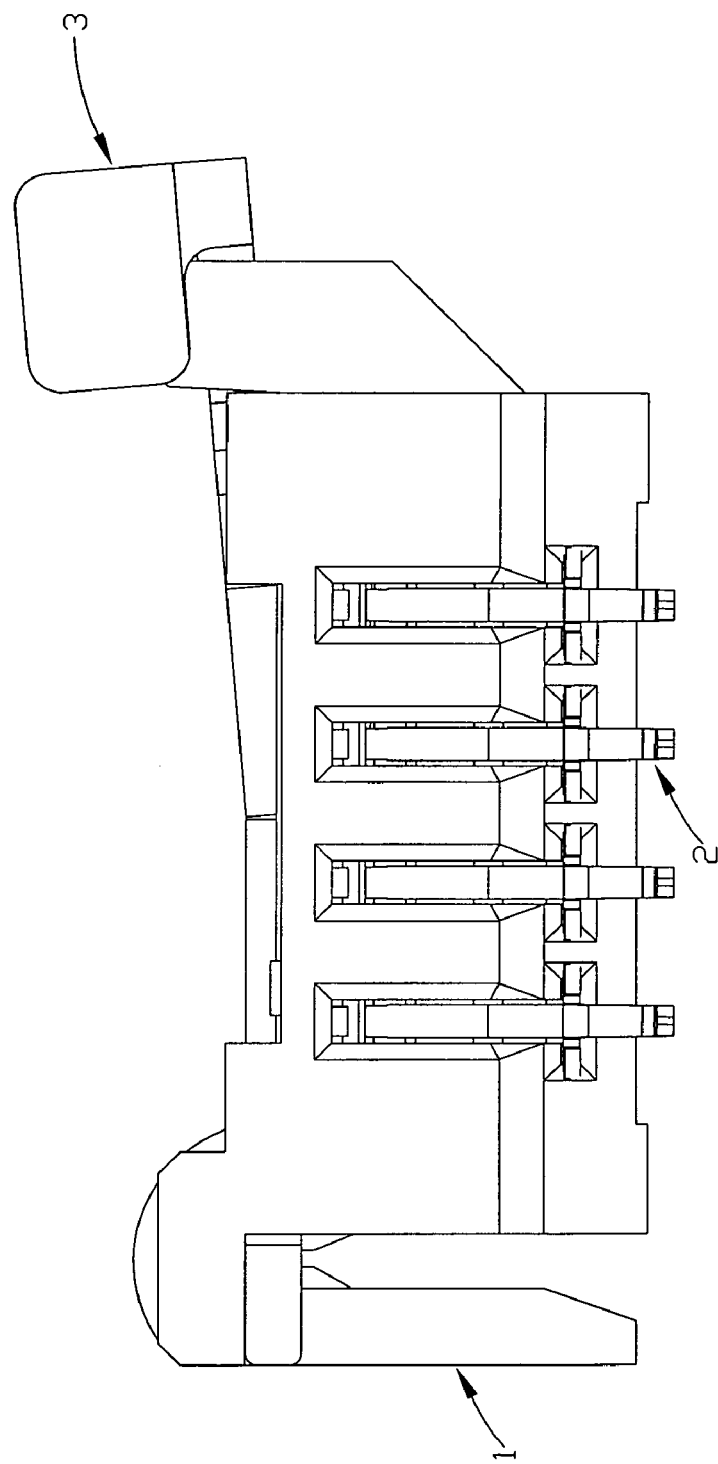
FIG. 2 is a front view of the electric connector of the present invention.
Figure 3:
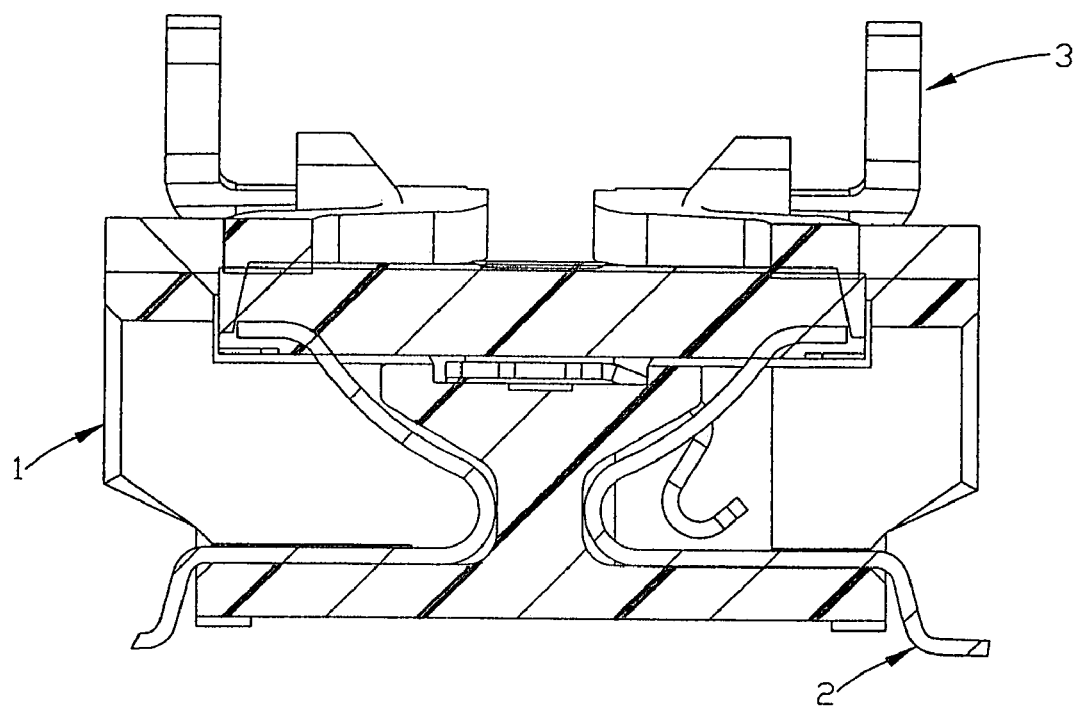
FIG. 3 is a cross-sectional view of the electric connector of the present invention.
Figure 4:
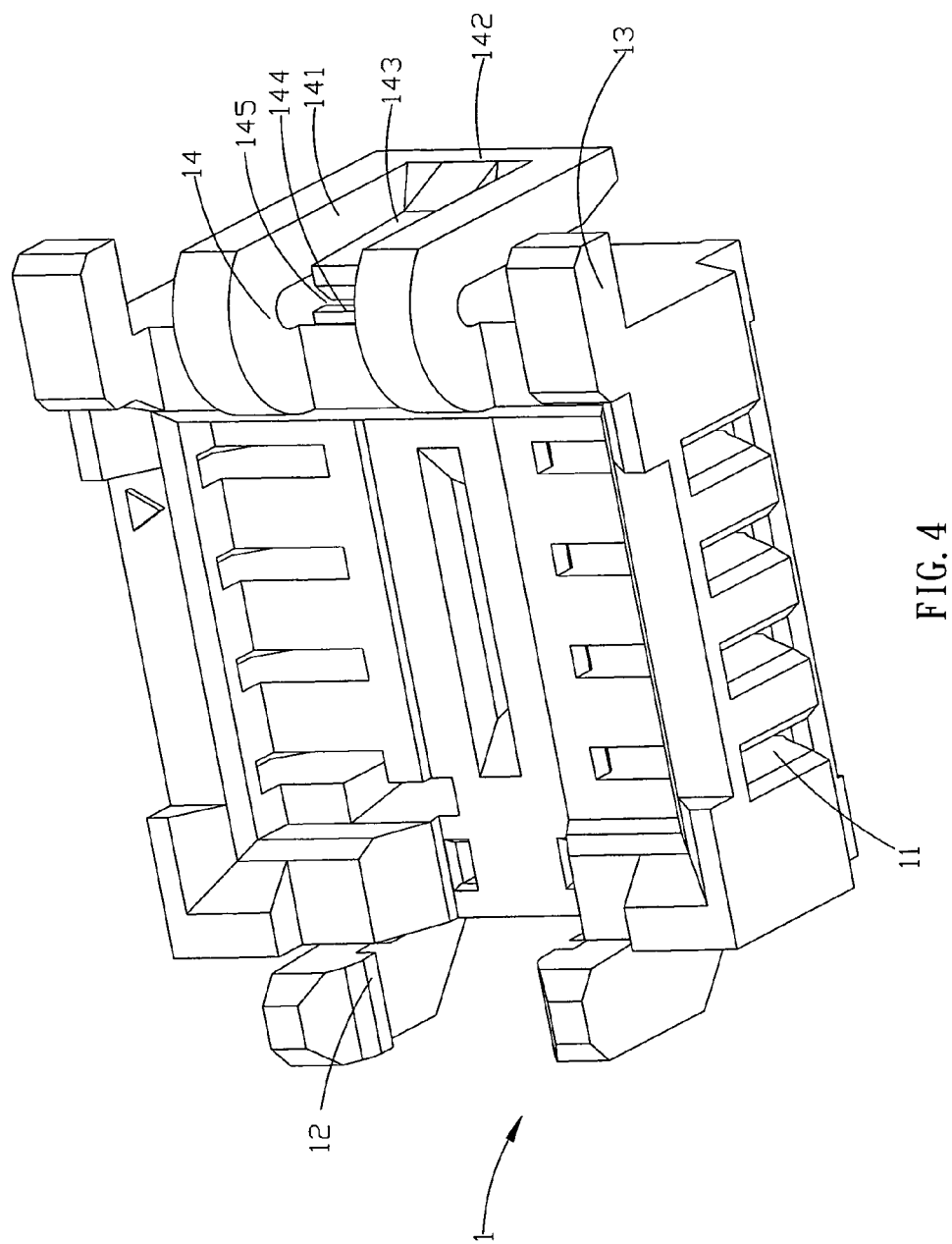
FIG. 4 is a perspective view of the insulating body of the electric connector of the present invention.
Figure 5:
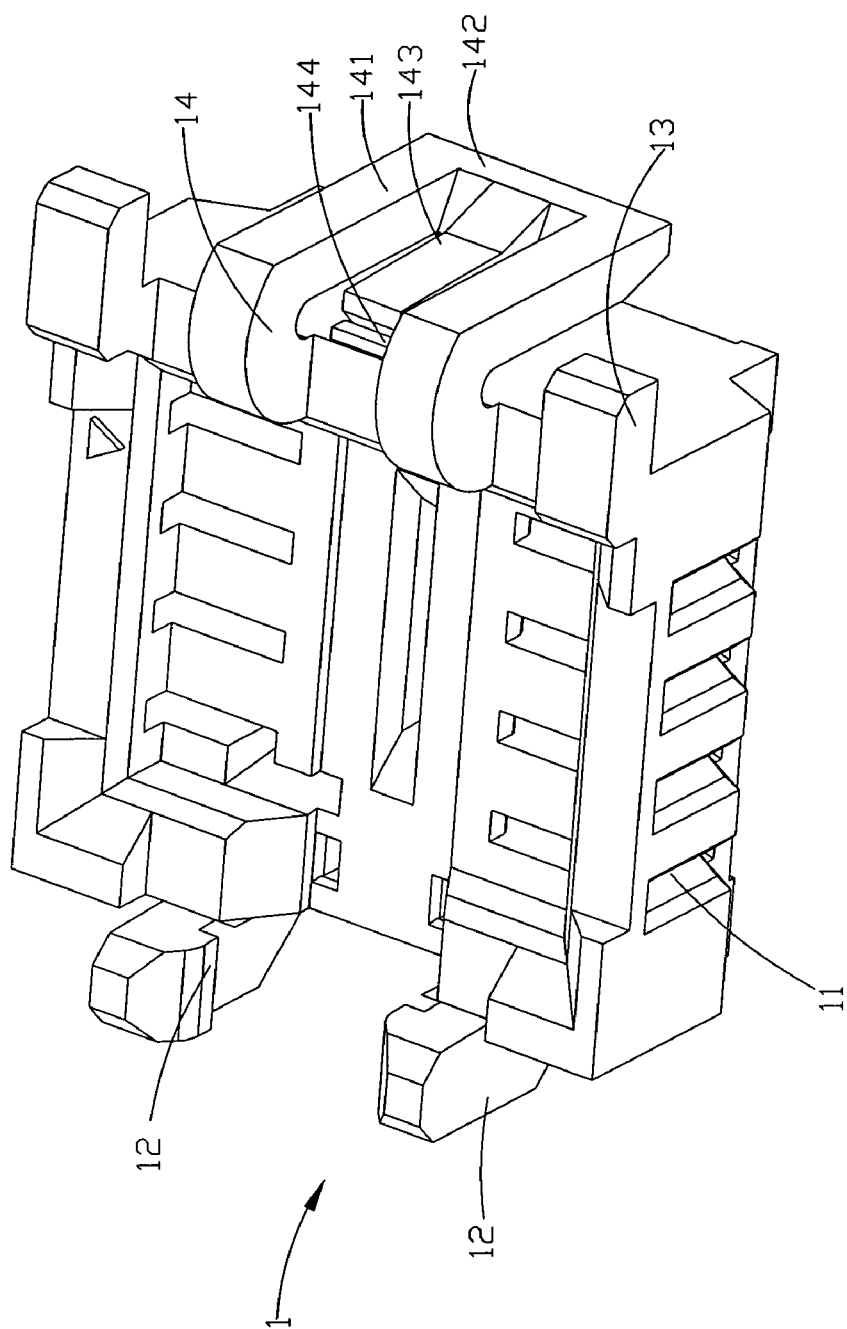
FIG. 5 is the other perspective view of the FIG. 4 of the insulating body.
Figure 6:
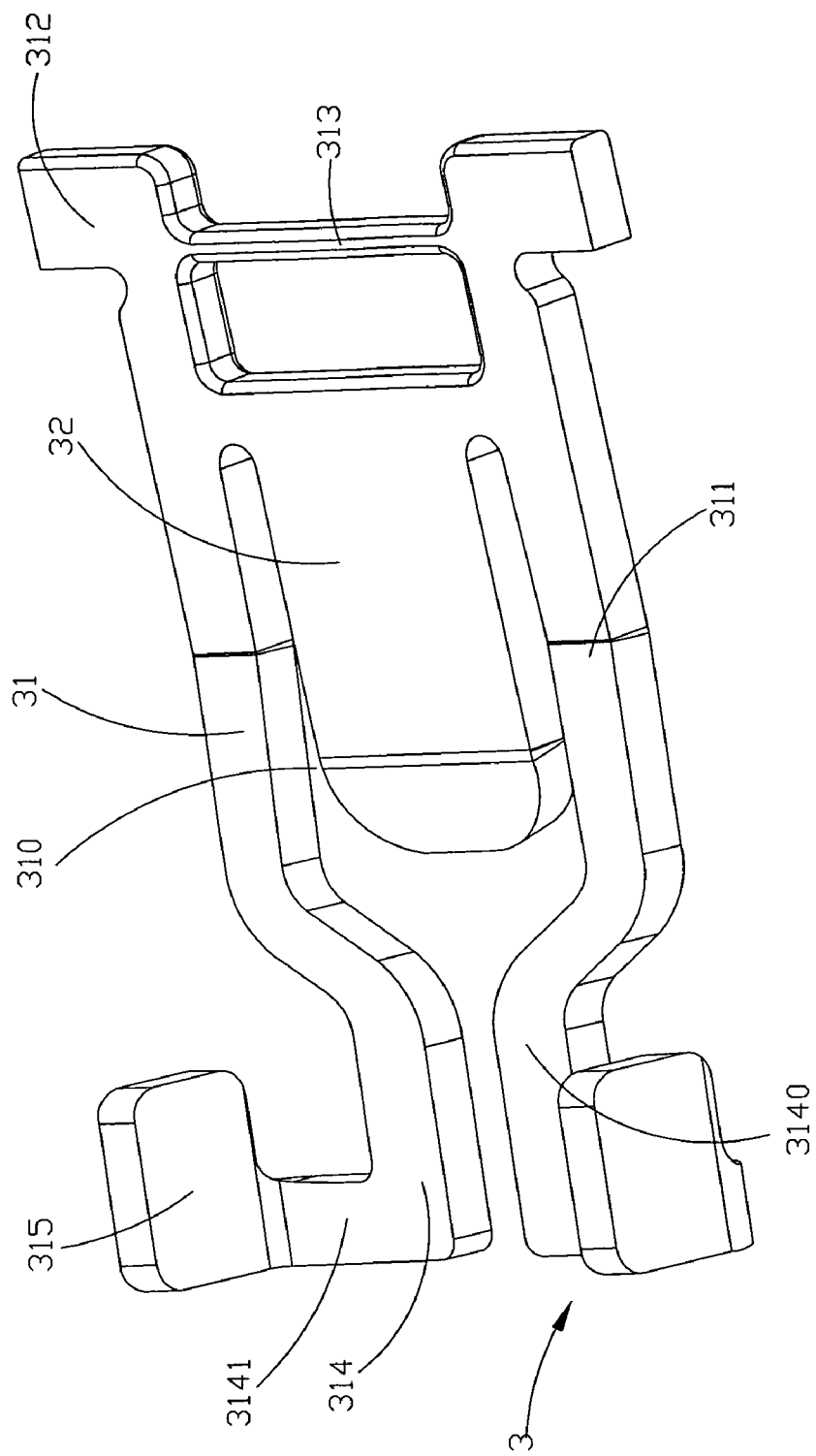
FIG. 6 is a perspective view of the press unit of the electric connector of the present invention.

Referring to FIGS. 1 to 6, the electric connector of the present invention is illustrated. The electric connector has an insulating body 1 with a plurality of receiving holes. Terminals 2 are received in the insulating body so as to suppress press units 3 of a chip module.

The symmetrical two sides of the insulating body 1 have a plurality of receiving grooves 11 on the middle of the insulating body 1 so as to receive the terminals 2. One end of the insulating body 1 protrudes out symmetrically forming at least one of the limiting bodies (in this embodiment, the limiting body is a hook portion 12). The other end of the insulating body protrudes out symmetrically forming protrusions 13. Besides, a hook 14 is formed at the same side of the adjacent protrusion 13 close to the middle of the side. The hook 14 is shaped into a cambered shape. Besides, the end of the hook 14 is vertical downwards to form two vertical portions 141. The two vertical portions 141 are connected by a level portion 142. The middle of the level portion 142 bends upwards to extend forming an elastic strip 143. A protruding strip 141 is formed on the middle of the end of the insulating body 1 corresponding to the elastic strip 143. A gap 145 is formed between the elastic strip 143 and the protruding strip 144.

The press unit 3 has at least one of the elastic arms 31 (in this embodiment, the two sides of the press unit 3 have two symmetrical elastic arms 31) and a suction portion 32 (in this embodiment, the suction portion 32 is located between the elastic arms 31 and a gap 310 is formed between the suction portion 32 and the elastic arm 31). Close to the middle of the elastic arm 31 has a bending downwards press portion 311 so as to press the chip module. At the other end of the elastic arm 31 is extended backwards with a stop portion 312. The stop portion 312 is connected to a pivotal. At the other opposite end of the elastic arm 31 is extended forwards with a separating buckling portion 314. The buckling portion 314 includes a longitudinal plate 3140 and a transversal plate 3141 vertical to the longitudinal plate 3140. The lateral side of the transversal plate 3141 bends upwards and is extended with forming a driving portion 315 vertical to the transversal plate 3141. Besides, the lower edge of the driving portion 315 is lower than the upper edge of the hook portion 12.

Whiling assembling, an axial portion 313, at first, passes through the gap 145 and is buckled between the protruding strip 144 and upper end of the elastic strip 143 at first. Then, the axial portion 313 is buckled under the hook 14 so as to retain the press unit 3 on the insulating body 1. Whiling disassembling, the press unit 3 is disassembled to the insulating body 1. The driving portion 315 is needed to be driven inwards so as to separate the buckling portion 314 of the elastic arm 31 to the limiting body (e.g. the hook portion 12). Besides, the lower edge of the driving portion 315 is lower than the upper edge of the hook portion 12 so that the driving portion 315 is not capable of over moving inwards, which protect the elastic arm 31 preventing from thereof being deformed improperly.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An electric connector comprising:

an insulating body;

a plurality of terminals being received in the insulating body;

a press unit pressing a chip module;

wherein the press unit has at least one of elastic arms; the press unit is extended with a driving portion; the insulating body has at least one hook portion; and the hook portion serves to limit the movement of the elastic arm so as not to over deform during driving the driving portion, wherein the elastic arm is extended with a buckling portion; and the buckling portion is buckled under the hook portion.

2. The electric connector as claimed in claim 1, wherein the driving portion is bent upwardly and extending from the buckling portion.

3. The electric connector as claimed in claim 2, wherein the driving portion is vertical to the buckling portion.

4. The electric connector as claimed in claim 1, wherein the elastic arm is extended backwards with a stop portion.

5. The electric connector as claimed in claim 1, wherein the elastic arm has a press portion.

6. The electric connector as claimed in claim 1, wherein the elastic arm is located on two sides of a press portion.

7. The electric connector as claimed in claim 6, wherein between the two elastic arms is a suction portion.

8. The electric connector as claimed in claim 7, wherein a gap is formed between the elastic arm and the suction portion.

* * * * *